US006373236B1

(12) United States Patent
Lemay, Jr. et al.

(10) Patent No.: US 6,373,236 B1
(45) Date of Patent: Apr. 16, 2002

(54) TEMPERATURE COMPENSATED POWER DETECTOR

(75) Inventors: Normand T. Lemay, Jr., Minneapolis, MN (US); Eric Sadowski, Indianapolis, IN (US)

(73) Assignee: Itron, Inc., Spokane, WA (US)

( * ) Notice: Subject to any disclaimer, the term of this patent is extended or adjusted under 35 U.S.C. 154(b) by 0 days.

(21) Appl. No.: 09/433,331

(22) Filed: Nov. 3, 1999

Related U.S. Application Data

(60) Provisional application No. 60/120,641, filed on Feb. 18, 1999.

(51) Int. Cl.[7] .................. G01R 23/04; G01R 27/04; G01R 27/00; G01R 27/26; H03M 1/00
(52) U.S. Cl. .................. 324/95; 324/648; 324/600; 324/685; 324/721; 324/72.5; 323/369; 323/907
(58) Field of Search .................. 324/600, 685, 324/721, 72.5, 95, 648; 323/369, 907

(56) References Cited

U.S. PATENT DOCUMENTS

| | | | |
|---|---|---|---|
| 2,853,601 A | | 9/1958 | McKenna et al. |
| 3,248,654 A | | 4/1966 | Shiragaki |
| 3,668,533 A | | 6/1972 | Fish et al. |
| 3,914,689 A | | 10/1975 | Wright |
| 3,956,661 A | * | 5/1976 | Sakamoto et al. ...... 323/907 X |
| 4,205,263 A | | 5/1980 | Kawagai et al. |
| 4,412,337 A | | 10/1983 | Bickley et al. |
| 4,970,456 A | * | 11/1990 | Holcomb et al. ............. 324/95 |
| 5,128,629 A | | 7/1992 | Trinh |
| 5,220,273 A | * | 6/1993 | Mao ........................... 323/313 |
| 5,371,473 A | | 12/1994 | Trinh et al. |
| 5,621,307 A | * | 4/1997 | Beggs ........................ 323/313 |
| 5,659,253 A | * | 8/1997 | Busking ..................... 324/648 |

* cited by examiner

*Primary Examiner*—Safet Metjahic
*Assistant Examiner*—Wasseem H. Hamdan
(74) *Attorney, Agent, or Firm*—Patterson, Thuente, Skaar & Christensen, P.A.

(57) ABSTRACT

A temperature compensated power detector generally comprises a detector circuit portion, which includes a detector diode, and a temperature compensation circuit portion, which includes a temperature compensation diode, that is operably connected to the detector circuit portion. The detector diode and the temperature compensation diode are connected in DC series with each other and develop substantially identical voltage drops. The detector circuit portion operates to detect a voltage from a power input. However, the detected voltage is subject to alteration due to temperature variations. The temperature compensation circuit portion develops a voltage that is also subject to alteration due to temperature variations. The temperature altered voltage of the temperature compensation circuit portion is used to cancel out the temperature altered voltage of the detector circuit portion allowing the power detector to produce a true voltage output.

30 Claims, 4 Drawing Sheets

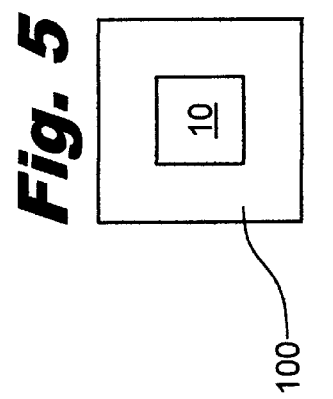
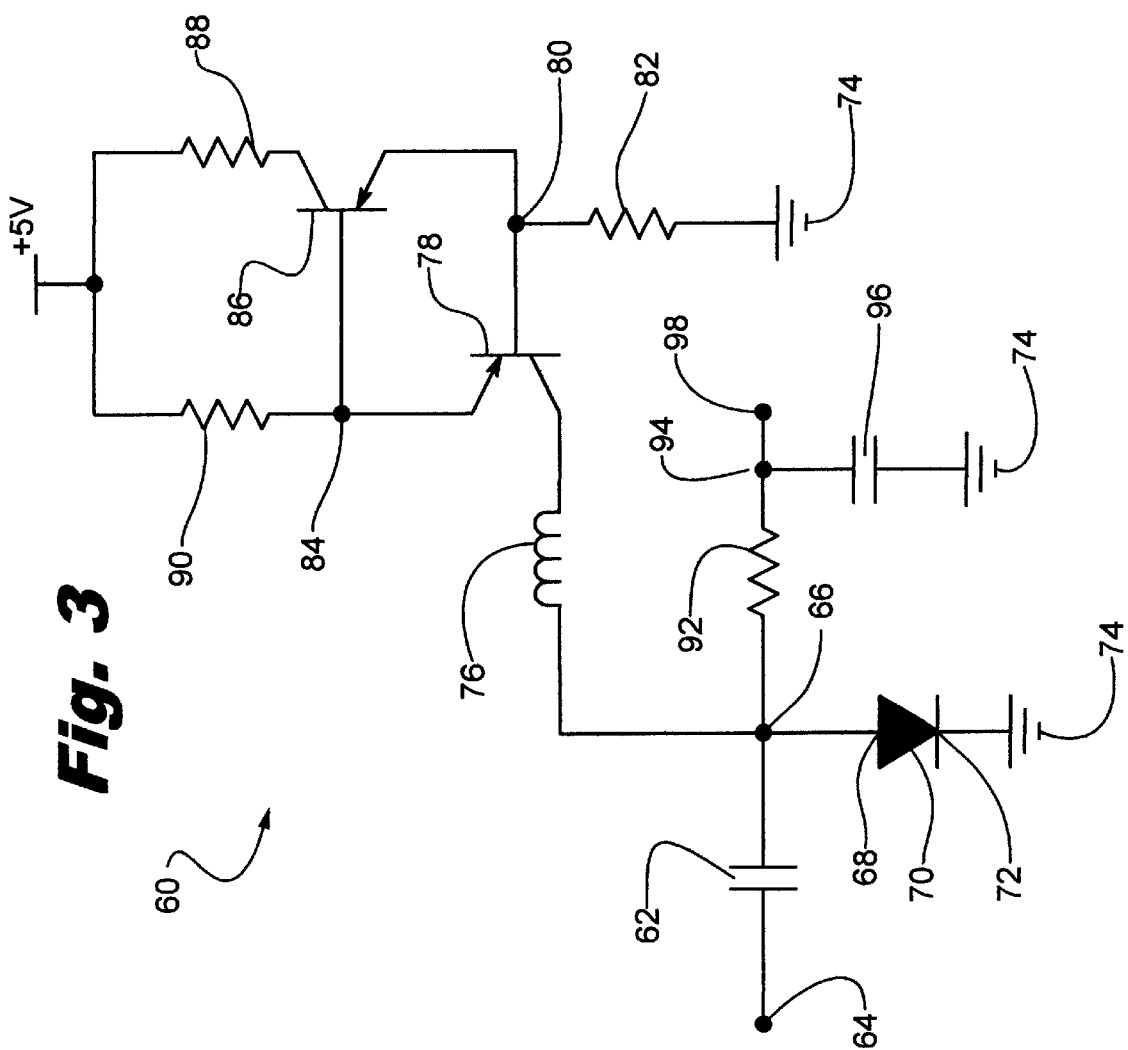

TEMPERATURE COMPENSATED POWER DETECTOR

RELATED APPLICATION

The present application claims the benefit of U.S. Provisional Application No. 60/120,641, filed Feb. 18, 1999, incorporated herein by reference.

FIELD OF THE INVENTION

The invention relates to power detection circuits, and more particularly, to power detection circuits which compensate for temperature variations.

BACKGROUND OF THE INVENTION

Power detection circuits are used in numerous applications where it is necessary to provide detection and/or measurement of the average power of a high frequency signal. Depending on the application, it may be necessary for the power detection circuit to operate over a wide range of temperatures. In such an application, it is essential for accuracy of measurement and efficient operation that the power detection circuit provide a consistent output for a given power input over the range of temperatures.

However, a common component used within power detection circuits, namely a diode, is sensitive to temperature changes, e.g., a junction voltage change of approximately 1 millivolt per degree Celsius. As such, there have been attempts in the art to compensate for this temperature change. U.S. Pat. No. 4,970,456 discloses a temperature compensated power detector. In the '456 power detector circuit, a first power detection diode is provided on the positive input of an amplifier and a second temperature compensating diode is used on the inverting input of the amplifier. Paths to each of the diodes are provided with resistances which are arranged in an attempt to bias each of the diodes at approximately the same points on their operating characteristics and thus, allowing the temperature compensating diode to cancel the temperature sensitive component of the power detection diode at the input to the amplifier.

The power detection circuit of the '456 patent is a reasonable approach to temperature compensation, however, the reliability and effectiveness of the circuit is very much, and undesirably so, dependent on how well the diodes are matched as well as how well the biasing circuitry is matched.

U.S. Pat. No. 5,371,473 describes a thermally stable automatic level control circuit for pulsed output amplifiers which utilizes a temperature compensated power detection scheme. In the '473 patent a single diode is used for power detection. In operation, the power detection scheme exploits the discontinuous pulse transmission to extract the thermally borne voltage of the power detector between transmission bursts, hold that voltage, and then subtract that voltage from the power detection voltage during a transmission burst to provide a true voltage.

The power detection scheme of the '473 patent is also a reasonable approach to temperature compensation, however, sample and hold circuitry is required in addition to the power detector circuitry which complicates the overall circuit and adds to the overall cost.

In view of the above, there is a need for a temperature compensated power detector which is not overly reliant on the matching of electrical characteristics of its biasing circuitry, and which does not require sample and hold circuitry.

SUMMARY OF THE INVENTION

The needs above are in large measure solved by a temperature compensated power detector of the present invention. The temperature compensated power detector generally comprises a detector circuit portion, which includes a detector diode, and a temperature compensation circuit portion, which includes a temperature compensation diode; the temperature compensation circuit portion is operably connected to the detector circuit portion. The detector diode and the temperature compensation diode are connected in DC series with each other and develop substantially identical voltage drops. The detector circuit portion operates to detect a voltage from a power input. However, the detected voltage is subject to alteration due to temperature variations. The temperature compensation circuit portion develops a voltage that is also subject to alteration due to temperature variations. The temperature altered voltage of the temperature compensation circuit portion is used to cancel out the temperature altered voltage of the detector circuit portion allowing the power detector to produce a true voltage output.

A method for producing a substantially temperature independent voltage output that is representative of a power input generally comprises the following steps: (1) receiving the power input; (2) detecting the envelope voltage of the power input with a detector circuit portion that includes a detector diode; (3) temperature compensating the detected voltage with a compensator circuit portion which includes a temperature compensation diode that is in DC series with the detector diode; and (4) outputting the temperature compensated detected voltage.

DESCRIPTION OF THE DRAWINGS

FIG. 3 depicts a non-temperature compensated power detector.

FIG. 5 depicts the power detector of FIG. 1 implemented as an integrated circuit.

DESCRIPTION OF THE PREFERRED EMBODIMENTS

Figure 1:
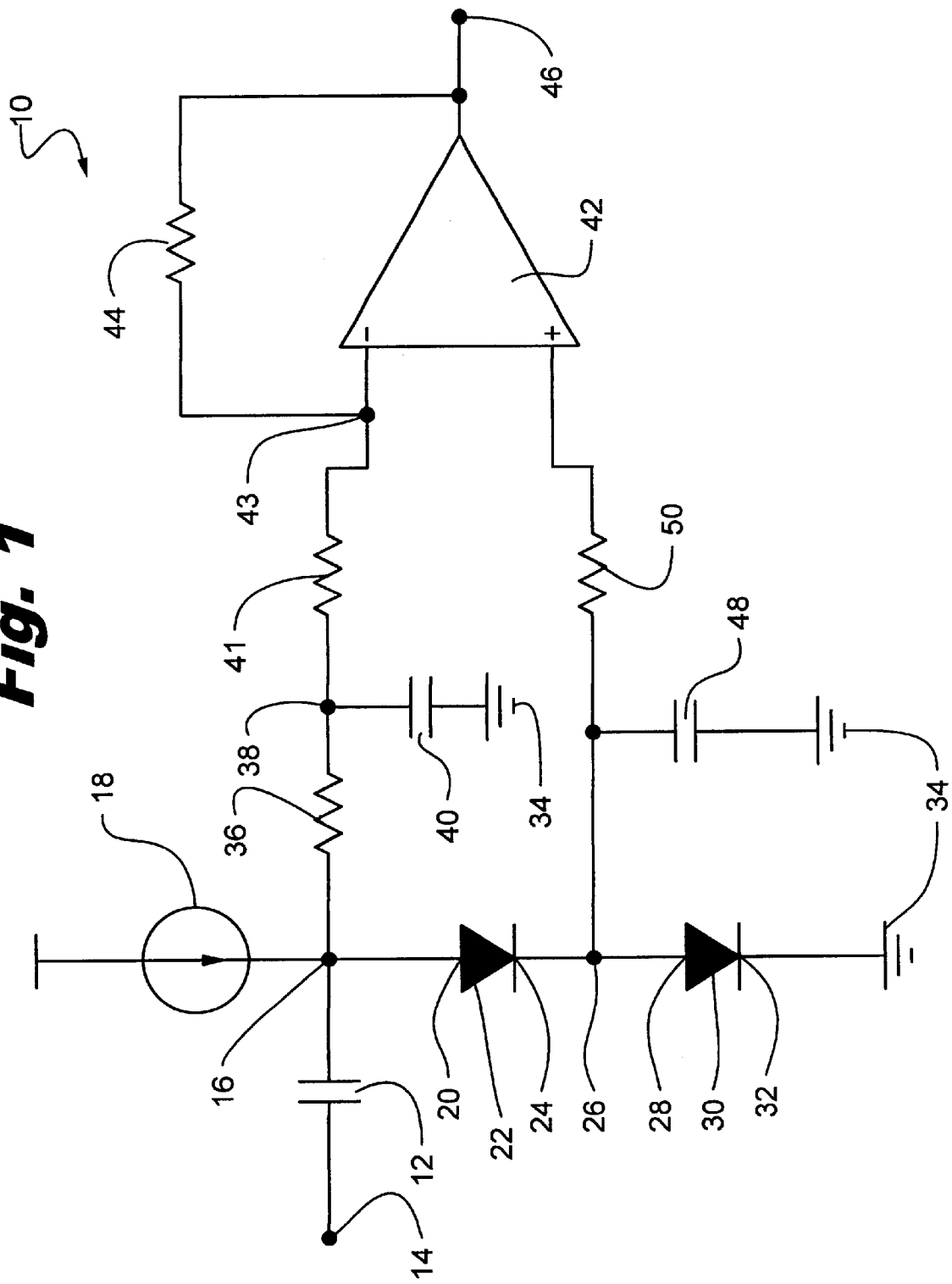
FIG. 1 depicts a temperature compensated power detector of the present invention.

A temperature compensated power detector 10 of the present invention is shown in FIG. 1. Power detector 10 includes a coupling capacitor 12 that is connected between power input 14 and node 16. A current source 18 is also coupled to node 16 which is connected to anode 20 of detection diode 22. Cathode 24 of detection diode 22 is connected to node 26 which is connected to anode 28 of temperature compensation diode 30. Cathode 32 of temperature compensation diode 30 is connected to ground 34. A resistor 36 is connected between node 16 and node 38 while a capacitor 40 is connected between node 38 and ground 34. A resistor 41 is connected between node 38 and a node 43. Node 43 is fed to the inverting input of amplifier 42. A feedback resistor 44 connects node 43 and voltage output 46 of amplifier 42. A capacitor 48 is connected between node 26 and ground 34. And, a resistor 50 is connected between node 26 and the non-inverting input of amplifier 42.

As shown, detector diode 22 and temperature compensation diode 30 are in DC series with each other allowing the same current to flow through both diodes and, thus, developing a substantially identical voltage drop across both diodes. Optimal performance, i.e., closer matching of the voltage drop across the diodes, can be achieved if matching diodes in the same package are used. Resistors 41, 44 and 50 are preferably selected such that $R_{41}=R_{44}=R_{50}$. The preferred component values are provided below in Table 1. Of course, other component values may be used without departing from the spirit or scope of the invention.

TABLE 1

| Resistors 41, 44, 50 | 100 kiloOhms |
|---|---|
| Resistor 36 | 360 Ohms |
| Capacitor 12 | 18 picoFarads |
| Capacitor 40 | 22 picoFarads |
| Capacitor 48 | 1000 picoFarads |

Thus, the affect on power detector output voltage 46 due to a change in voltage drop across diodes 22 and 30 due to temperature variation may be determined by reviewing power detector 10 in a static state, i.e., no power input. The detector output voltage is defined as follows:

$$V_0 = \frac{-R_{44}}{R_{41}}(V_{16}) + V_{26}\left(\frac{R_{44}}{R_{41}} + 1\right) \qquad \text{Eq. (1)}$$

where, in the static state:

$$V_{16}=2V_D \text{ and } V_{26}=V_D.$$

Note that $V_{16}$ is the voltage at node 16, $V_{26}$ is the voltage at node 26, and $V_D$ is the voltage across one diode. Knowing that $R_{44}=R_{41}$ and substituting for $V_{16}$ and $V_{26}$, Equation 1 becomes:

$$V_O=-2V_D+2V_D=0 \qquad \text{Eq. (2)}$$

Thus, the change in diode voltage due to temperature change is canceled out, allowing power detector 10 to provide a true voltage output that is unaffected by temperature.

Figure 2:
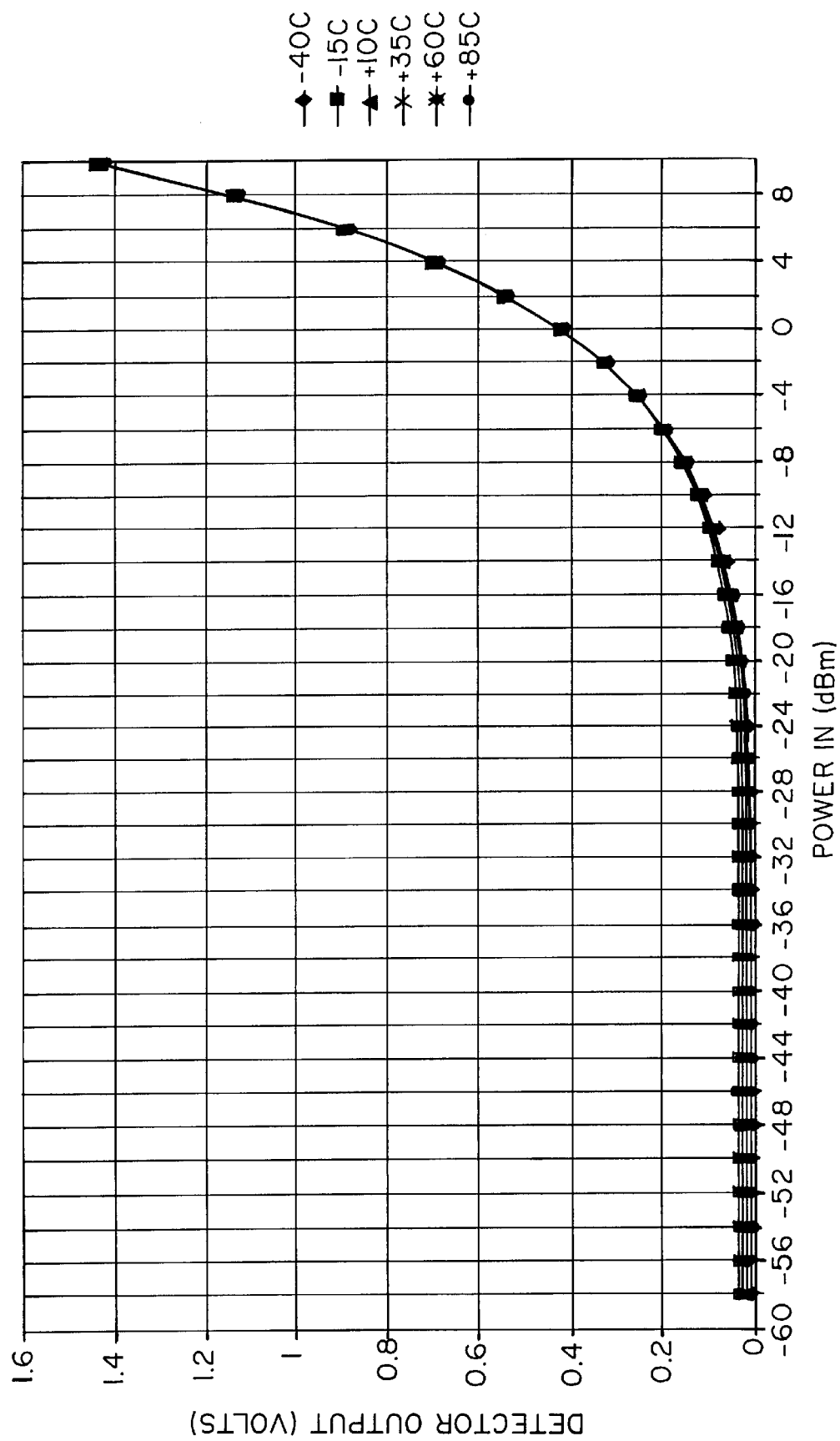
FIG. 2 depicts the operation of the power detector of FIG. 1 over a range of temperatures in a plot of power detector output (volts) vs. power input (dBm).

FIG. 2 provides a plot that is representative of the operation of power detector 10 of the present invention. The plot depicts power detector output voltage versus power input in dBm at the temperatures of −400 C., −150 C., +100 C., +350 C., +600 C., and +850 C. As the plot indicates, the output voltage is substantially consistent for a given power input over the range of temperatures. Note that this plot was created with power detector 10 utilizing two HP-HSM52860 diodes in separate packages; as indicated above, even better performance is achievable if matching diodes in the same package are used.

To exemplify the benefits provided by temperature compensated power detector 10, a non-temperature compensated power detector 60, shown in FIG. 3, is provided for comparison. In power detector 60, a coupling capacitor 62 is provided between power input 64 and node 66. Anode 68 of detector diode 70 is also connected to node 66 while cathode 72 of diode 70 is connected to ground 74. An inductor 76 is connected between node 66 and the collector of a first PNP 78. The base of PNP 78 is connected to node 80. Connected between node 80 and ground 74 is a resistor 82. The emitter of PNP 78 is tied to node 84 as is the base of a second PNP 86. The collector of PNP 86 is connected to node 80 while the emitter of PNP 86 is connected to a resistor 88. The other terminal end of resistor 88 is tied to a positive voltage source (e.g., +5 V). A resistor 90 is also tied to the voltage source and to node 84. A resistor 92 is connected between node 66 and a node 94. A capacitor 96 is connected between node 94 and ground 74. Voltage output at node 98 is also connected to node 94. Suitable component values are provided in Table 2.

TABLE 2

| Resistors 82, 88 | 200 kilo-ohms |
|---|---|
| Resistor 86 | 240 kilo-ohms |
| Resistor 92 | 360 ohms |
| Inductor 76 | 18 milliHenries |
| Capacitor 62 | 18 picoFarads |
| Capacitor 96 | 22 picoFarads |

Figure 4:
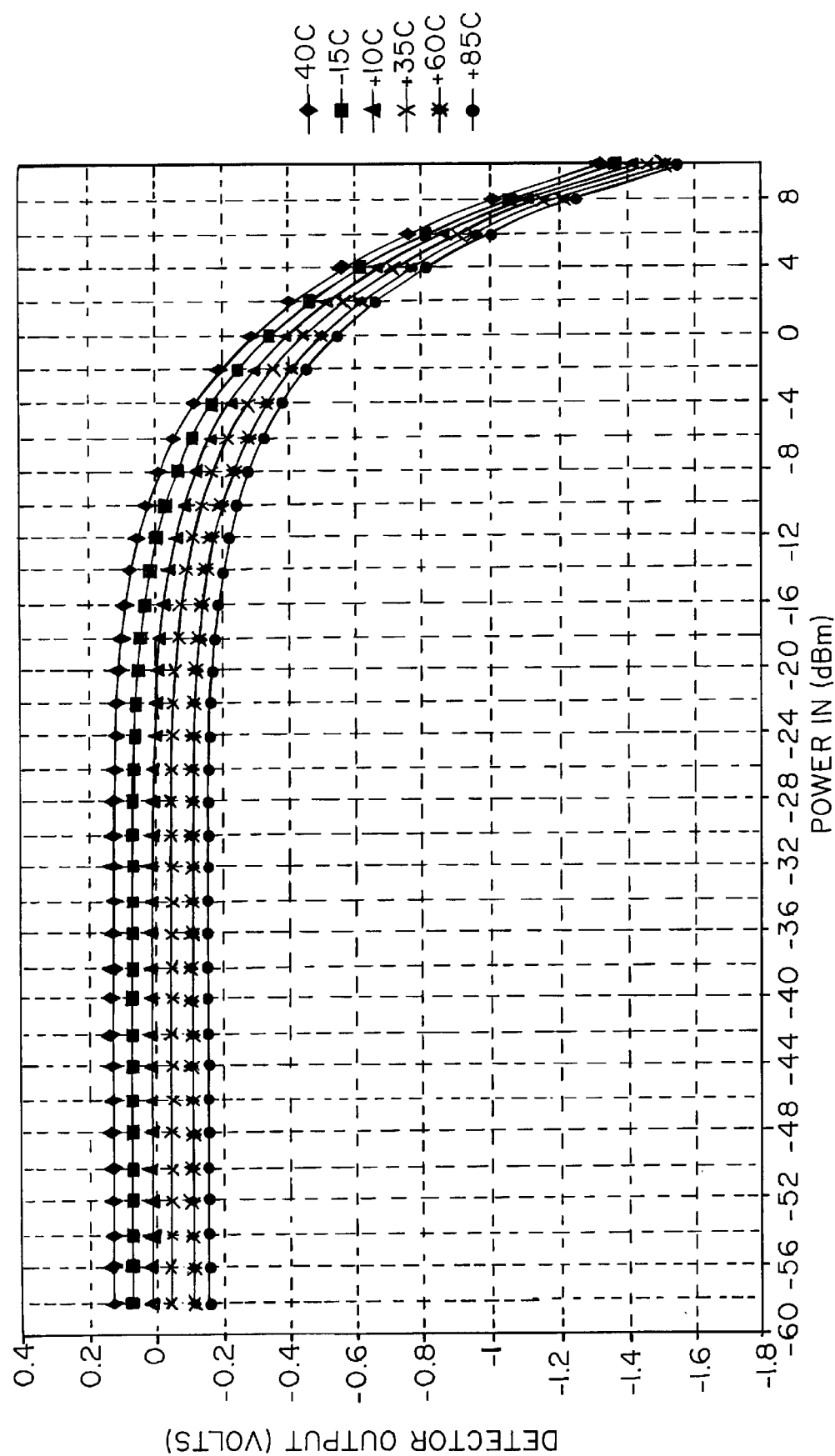
FIG. 4 depicts the operation of the power detector of FIG. 3 over a range temperatures in a plot of power detector output (volts) vs. power input (dBm).

FIG. 4 provides a plot that is representative of the operation of power detector 60. The plot depicts power detector output voltage versus power input in dBm at the same temperatures as the previous plot, i.e., −400 C., −150 C., +100 C., +350 C., +600 C, and +850 C. As the plot indicates, a DC offset is prevalent in the output voltage when varied over temperature; the DC offset voltage decreases with increasing power input.

In summary, temperature compensated power detector 10 of the present invention is able to eliminate temperature dependence, e.g., a less than 2% error, over a range of 1250 C. and a 30 dB detection range by placing in DC series with each other detector diode 22 and temperature compensation diode 30. Further, by utilizing a current source for DC biasing of both detector diode 22 and temperature compensation diode 30, a consistent tangential sensitivity over temperature is provided for power detector 10. Note that any or all portions of power detector 10 may be implemented in the form of an integrated circuit 100 as shown in FIG. 5.

The present invention may be embodied in other specific forms without departing from the essential attributes thereof; therefore, the illustrated embodiments should be considered in all respects as illustrative and not restrictive, reference being made to the appended claims rather than to the foregoing description to indicate the scope of the invention.

What is claimed:

1. A temperature compensated power detector, comprising: a detector portion including a detector diode, wherein said detector portion receives a power input; and a temperature compensation portion operably coupled to said detector portion, said temperature compensation portion including a temperature compensation diode, wherein said detector diode and said temperature compensation diode are in DC series with each other, are biased by a constant current source, and develop substantially identical voltage drops, wherein the substantially identical voltage drops enable said temperature compensation portion to cancel the affect of a change in voltage to said detector diode and to said temperature compensation diode that is caused by a temperature variation, and wherein the cancellation of the affect enables said power detector to produce a temperature-unaffected output that is representative of said power input.

2. The power detector of claim 1, wherein said current source DC biases both said detector diode and said temperature compensation diode.

3. The power detector of claim 1, wherein said detector portion detects an envelope voltage of a power input, wherein the detected voltage is altered by temperature variations, and wherein said temperature compensation portion substantially cancels out the alteration of said detected voltage that is caused by said temperature variations.

4. The power detector of claim 1, wherein said power detector is operational over at least a 1250 degrss C. temperature range.

5. The power detector of claim 1, wherein said power detector is operational over at least a 30 dB range.

6. The power detector of claim 1, wherein said power detector provides a substantially consistent tangential sensitivity over at least a 1250 degrees C. temperature range.

7. A temperature compensated power detector, comprising:
    detector means for receiving a power input and producing a voltage output, the voltage output being a positive representation of said power input, said detector means including constant current source means for providing a DC bias, said detector means further including first means for carrying current in one direction wherein said first means is altered by temperature variations; and temperature compensation means for canceling out the alteration in said first means, said temperature compensation means operably coupled to said detector means, said temperature compensation means including second means being alterable by temperature variations, and wherein said first means and said second means are in DC series with each other.

8. The power detector of claim 7, wherein said power detector is operational over at least a 1250 degrees C. temperature range.

9. The power detector of claim 7, wherein said power detector is operational over at least a 30 dB range.

10. The power detector of claim 7, wherein said power detector provides a substantially consistent tangential sensitivity over at least a 1250 degrees C. temperature range.

11. The power detector of claim 7, wherein said power detector is implemented in integrated circuit form.

12. A method for producing a substantially temperature independent voltage output that is representative of a power input, comprising:
    receiving said power input;
    detecting the voltage of said power input with a detector circuit portion that includes a first diode;
    temperature compensating the detected voltage with a compensator circuit portion that includes a second diode in DC series with said first diode;
    biasing said detector circuit portion and said temperature compensator circuit portion by a constant current source;
    maintaining a constant detector sensitivity by means of the constant current source; and
    thereby negating temperature variations of said first diode.

13. The method of claim 12, wherein said step of temperature compensating comprises canceling out a temperature affected voltage of said detector circuit portion with a temperature affected voltage of said compensator circuit portion.

14. The method of claim 12, further comprising DC biasing said first and second diodes with the current source.

15. A temperature compensated power detector having a selected circuitry, comprising: a detector portion including a detector diode, wherein said detector portion receives a power input; and a temperature compensation portion operably coupled to said detector portion, said temperature compensation portion including a temperature compensation diode, wherein said detector diode and said temperature compensation diode are in DC series with each other and develop substantially identical voltage drops absent any resistive biasing, wherein the substantially identical voltage drops enable said temperature compensation portion to cancel the affect of a change in voltage to said detector diode and to said temperature compensation diode that is caused by a temperature variation, and wherein the cancellation of the affect enables said power detector to produce a temperature-unaffected output that is representative of said power input.

16. The power detector of claim 15, wherein said detector portion includes a current source.

17. The power detector of claim 16, wherein said current source DC biases both said detector diode and said temperature compensation diode.

18. The power detector of claim 15, wherein said detector portion detects an envelope voltage of a power input, wherein the detected voltage is altered by temperature variations, and wherein said temperature compensation portion substantially cancels out the alteration of said detected voltage that is caused by said temperature variations.

19. The power detector of claim 15, wherein said power detector is operational over at least a 1250 degree C. temperature range.

20. The power detector of claim 15, wherein said power detector is operational over at least a 30 dB range.

21. The power detector of claim 15, wherein said power detector provides a substantially consistent tangential sensitivity over at least a 1250 degree C. temperature range.

22. A temperature compensated power detector for use in a detector circuit operating free of resistive diode biasing, comprising:
    detector means for receiving a power input and producing a voltage output, the voltage output being a positive representation of said power input, said detector means including constant current source means for providing a DC bias current, said detector means further including first means for carrying current in one direction wherein said first means is altered by temperature variations; and temperature compensation means for canceling out the alteration in said first means, said temperature compensation means operably coupled to said detector means, said temperature compensation means including second means for carrying current in one direction wherein said second means is altered by temperature variations, and wherein said first means and said second means are in DC series with each other.

23. The power detector of claim 22, wherein said means for providing current DC biases said first means and said second means.

24. The power detector of claim 23, wherein said power detector is operational over at least a 1250 degree C. temperature range.

25. The power detector of claim 22, wherein said power detector is operational over at least a 30 dB range.

26. The power detector of claim 22, wherein said power detector provides a substantially consistent tangential sensitivity over at least a 1250 degree C. temperature range.

27. The power detector of claim 22, wherein said power detector is implemented in integrated circuit form.

28. A method for producing a substantially temperature independent voltage output that is representative of a power input in a circuit operating free of resistive diode biasing, comprising:
    receiving said power input; detecting the voltage of said power input with a detector circuit portion that includes a first diode;
    temperature compensating the detected voltage with a compensator circuit portion that includes a second diode in DC series with said first diode; and
    negating temperature variations of the first diode by means of the temperature compensating.

29. The method of claim 28, wherein said step of temperature compensating comprises canceling out a temperature affected voltage of said detector circuit portion with a temperature affected voltage of said compensator circuit portion.

30. The method of claim 28, further comprising the step of DC biasing said first and second diodes with a current source.

* * * * *

UNITED STATES PATENT AND TRADEMARK OFFICE
CERTIFICATE OF CORRECTION

PATENT NO. : 6,373,236 B1 Page 1 of 1
DATED : April 16, 2002
INVENTOR(S) : Normand T. Lemay, Jr. and Eric Sadowski It is certified that error appears in the above-identified patent and that said Letters Patent is hereby corrected as shown below:

Drawings,
Fig. 5, should have "Integrated Circuit" inside box 100.
Fig. 5, should have "Power Detector" inside box 10.

Column 2,
Line 42, please insert "of" between the words "range" and "temperatures."

Column 3,
Line 38, please insert a "." at the end of the equation.

Signed and Sealed this

Fifth Day of November, 2002

*Attest:*

JAMES E. ROGAN
*Attesting Officer* *Director of the United States Patent and Trademark Office*